United States Patent [19]

Hottenrott et al.

[11] Patent Number: 4,518,910

[45] Date of Patent: May 21, 1985

[54] BUCKLING BEAM TWIST PROBE CONTACTOR ASSEMBLY WITH SPRING BIASED STRIPPER PLATE

[75] Inventors: Hans G. Hottenrott, Wappingers Falls, N.Y.; Philo B. Hodge, Roxbury, Conn.; Thomas J. Cochran, La Grangeville, N.Y.

[73] Assignee: International Business Machines Corporation, Armonk, N.Y.

[21] Appl. No.: 509,519

[22] Filed: Jun. 30, 1983

[51] Int. Cl.[3] ............... G01R 31/02; G01R 1/06
[52] U.S. Cl. ............... 324/158 P; 324/72.5; 324/158 F
[58] Field of Search ............... 324/158 P, 158 F, 72.5; 339/108 TP, 176 M

[56] References Cited

U.S. PATENT DOCUMENTS 3,806,801  4/1974  Bove ............... 324/72.5
4,063,172  12/1977  Faure et al. ............... 324/158 P

OTHER PUBLICATIONS

IBM Technical Disclosure Bulletin, vol. 15, No. 10, Mar. 1973, "Buckling Wire Probe Assembly" by L. D. Lipschutz et al., pp. 3032-3034.
IBM Technical Disclosure Bulletin, vol. 16, No. 5, Oct. 1973, p. 1366, "Buckling Beam Probe" by S. I. Bruder et al.
IBM Technical Disclosure Bulletin, vol. 17, No. 2, Jul. 1974, "Dual Buckling Beam Connectors for Test Probes" by S. I. Bruder et al., pp. 638-639.
IBM Technical Disclosure Bulletin, vol. 18, No. 8, Jan. 1976, "Test Probe" by L. H. Faure, pp. 2527-2528.

Primary Examiner—Ernest F. Karlsen
Attorney, Agent, or Firm—Sughrue, Mion, Zinn, Macpeak, and Seas

[57] ABSTRACT

The buckling beam probe contactor assembly utilizing buckling beams in the form of continuous wires from the probe tips to remote source connectors includes at least one post terminating in a spring biased plunger assembly fixed to an underlying stripper plate provided with holes through which the beams project and protects them from damage. The stripper plate acts to accurately position the probe tips. The buckling beams intermediate their ends are potted in a slidable assembly axially movable on the post and shifted by an adjusting nut to preposition the probe tips relative to the stripper plate. The stripper plate first contacts the product during upward movement of the product, and the stripper plate is forced upwardly against spring bias relative to the post, then the beams contact the product test points and deflect a predetermined amount to maintain biased low ohmage circuit completions with the product.

8 Claims, 3 Drawing Figures

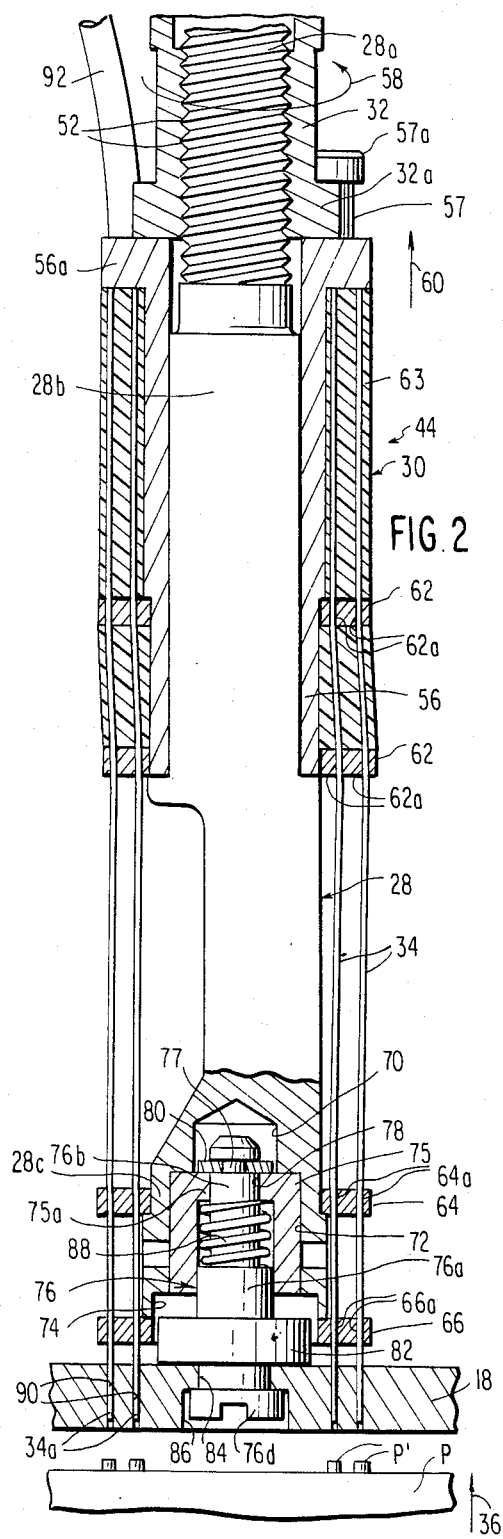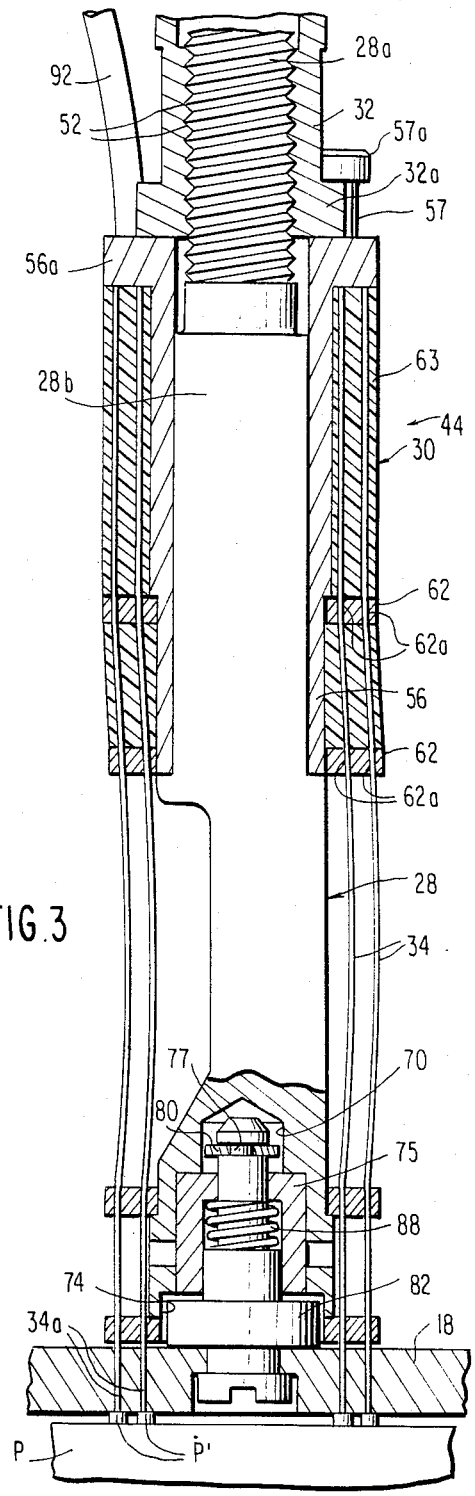

BUCKLING BEAM TWIST PROBE CONTACTOR ASSEMBLY WITH SPRING BIASED STRIPPER PLATE

FIELD OF THE INVENTION

This inventions relates to buckling beam probe contactors and more particularly to a contactor using a stripper plate to accurately position the beam probe tips by initial stripper plate contact with the underlying product and to such a probe contactor whose buckling beams constitute continuous wires from the probe tips at the stripper plate to the electrical connectors at the opposite ends thereof.

BACKGROUND OF THE INVENTION

Buckling beam probe contactors have been utilized in the testing of electrical characteristics of integrated circuits connected to pads on a semi-conductor chip wherein the probes of the probe contactor engage the pad to connect the pad to the test apparatus. Limited force application is needed to prevent damage to the pad or the chip. Additionally, since the pads are located in close proximity, thin deflectable wires functioning as buckling beams must have their contact tips accurately positioned with respect to the pads to prevent shorts between circuits.

In the past, space transformers have been required to complete the electrical circuit from the test equipment to the buckling beam probes which often results in an open circuit between the test equipment and a given beam of the probe assembly.

It is, therefore, a primary object of the present invention to provide an improved buckling beam probe contactor which eliminates both the need for a space transformer and the possibility of opens or shorts at the probe/transformer interface.

It is a further object of the present invention to provide an improved buckling beam probe contactor which utilizes a stripper plate for insuring a rapid and accurate alignment of the individual probe wires to the test points of a given product, which protects the probe tips from mechanical damage, which reduces cost and which increases product throughput and reliability of the electrical tests utilizing the probe contactor.

It is a further object of the present invention to provide an improved buckling beam probe contactor in which the need for extremely tight tolerances on the individual probe components is substantially reduced, and wherein the probe tips of the beams may be extended through the stripper plate, which functions to guide and protect the probe tips, to facilitate probe tip resurfacing as needed.

SUMMARY OF THE INVENTION

This invention is directed to a buckling beam test probe contactor assembly wherein an array of current carrying electrically conductive beams are mounted so as to buckle when biased into contact with the product to be tested. The improvement resides in the array of buckling beams comprising continuous wires from the test equipment connector to the product and wherein the contactor assembly comprises a support post movable, relatively, towards and away from the product, a carrier mounted on the support post with the wires fixedly mounted intermediate of their ends to the carrier and a stripper plate mounted by a spring loaded means to the support post overlying the product. Guide means carried by the stripper plate align the ends of the probe wires with the underlying product for precise contact with the product test points. Means are provided for adjusting the axial position of the carrier on the post to adjust the beams lengthwise of the stripper plate such that the stripper plate accurately locates the ends of the wires relative to the product. The wires function as uninterrupted conductors to reduce electric opens and shorts within the test equipment and the stripper plate protects the probe tips from damage.

A pin fixed to the stripper plate projects upwardly through the center of post at its lower end and is supported thereby. The pin is surrounded by a coil spring tending to bias the stripper plate away from the end of the post. Upon contact of the stripper plate with the top of the product being tested, the pin recesses within the post against the bias of the coil spring, causing the probe tips to extend to the bottom of the stripper to contact the product and during continued movement of the post relative to the underlying product, the beams deflect to maintain electrical contact between the beams and the product due to the force of beam deflection.

The carrier constitutes a potted slide assembly concentrically positioned on the post remote from the stripper plate and guided for movement paralled to the axis of the post by post-defined guide means. The post is threaded over an extent of this length and a rotatable nut threaded to the post threaded portion operatively engages the slide assembly such that upon rotation of the nut, the slide assembly shifts longitudinally relative to the post to move the beams relative to the stripper plate. Offset guides fixedly carried by the post define the direction of deflection of the beams during continued movement of the product after the probe tips are contacted by the product being tested.

A probe mount, elongated vertically and fixedly mounted, includes a horizontal arm which overlies the post and fixedly supports the upper end of the depending post. A spring plunger assembly borne by the probe mount is fixed at its lower end to the stripper plate such that upon contact of the stripper plate with the product, the plunger assembly carried by the post and the probe mount spring plunger assembly compress into the post and the probe mount, respectively, to stabilize stripper plate movement relative to the support post and the probe mount supporting that post, to maintain horizontal orientation of the stripper plate during its movement, and to fully absorb the thrust force of the stripper plate acting on the product being tested.

BRIEF DESCRIPTION OF THE DRAWINGS

FIG. 2 is a vertical elevational view, partially in section and partially broken away, of one of the probe assemblies for the probe contactor of FIG. 1, prior to contact of the stripper plate with the test product and deflection of the beam.

FIG. 3 is a similar elevational view to that of FIG. 2 after contact of the stripper plate with the product and deflection of the beams under applied force.

DESCRIPTION OF THE PREFERRED EMBODIMENT

Figure 1:
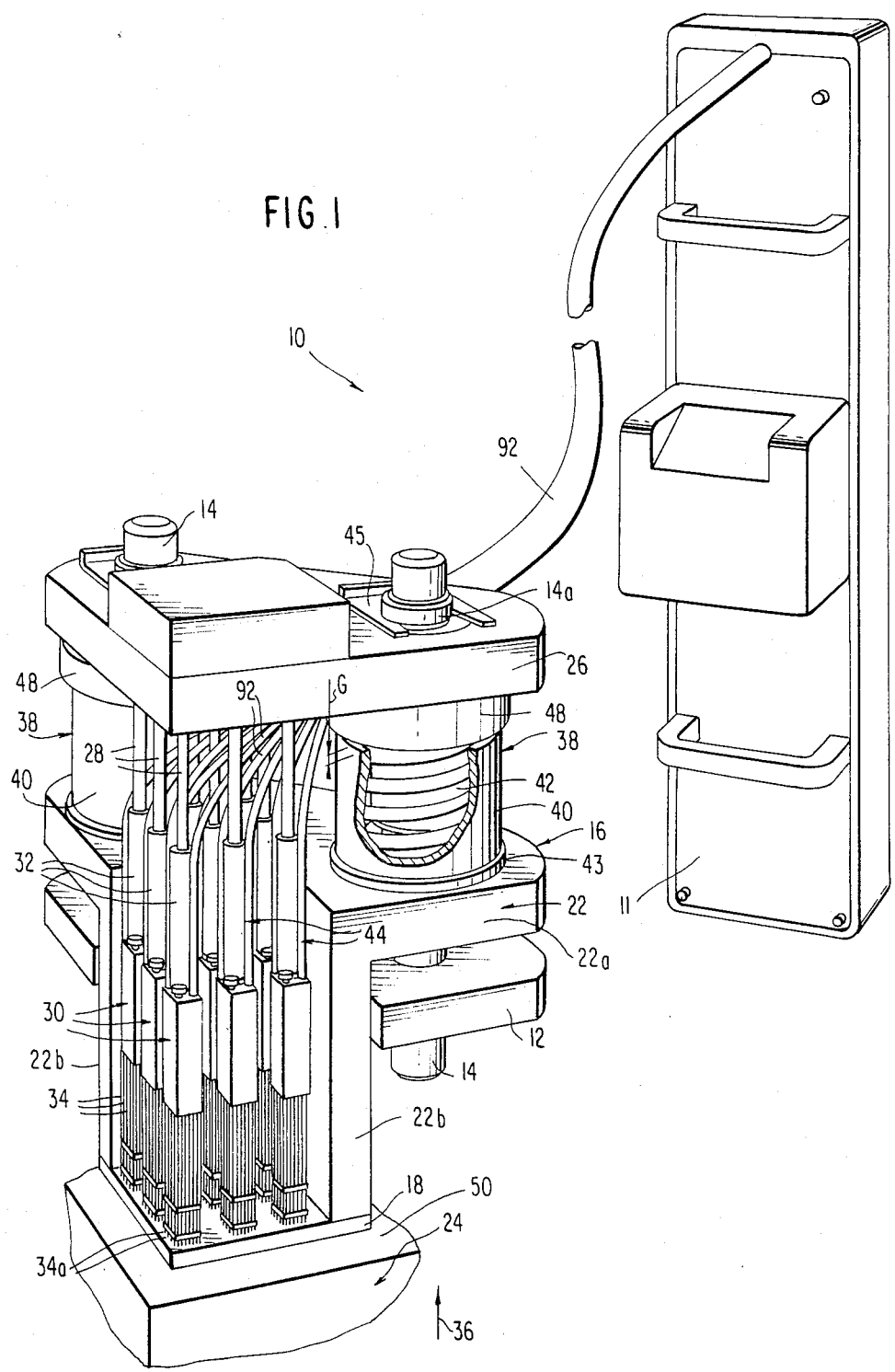
FIG. 1 is a perspective view of a quad assembly buckling beam probe contactor forming a preferred embodiment of the invention.

Referring to the drawings and particularly FIG. 1, there is shown a quad assembly buckling beam probe contactor assembly indicated generally at 10 forming a preferred embodiment of the present invention. The probe contacter 10 comprises a relatively fixed probe mount indicated generally at 12 which supports a pair of vertical rods as at 14 which extend upwardly therefrom and which project through a horizontal plate portion 22a of a probe mount stripper plate assembly indicated generally at 16. Assembly 16 is constituted by a flat rectangular stripper plate 18 fixed to the ends of right angle vertical walls 22b of a machined body 22 which terminates in horizontal plate portion 22a. Portion 22a has paired holes (not shown) through which rods 14 project.

The rods 14 include collars 14a at their upper ends, and the rods 14 pass through circular holes of slightly larger diameter within a platelike head member 26, at each rod location. Fixedly mounted to the head member 26 and projecting downwardly therefrom are a series of posts as at 28 bearing vertically adjustable potted slide assemblies or carriers, indicated generally at 30, the carriers being coupled at their upper ends to adjusting nuts as at 32 which are threaded to the posts, as will be disclosed hereinafter, to effect vertical raising and lowering of a number of coated buckling beams indicated generally at 34. Beams 34 comprise very fine metal wires whose lower ends constitute probe tips 34a which project within suitable small diameter holes 90 within stripper plate 18. Probe tips 34a make contact with the upper surface of a product P, FIGS. 2, 3, being tested when table 24, bearing such products, moves upwardly in the direction of arrow 36, FIG. 1.

A pair of spring plunger assemblies indicated generally at 38 are each comprised of a cylindrical casing 40 bearing internally a helical coil spring 42 which functions to bias the probe mount stripping plate assembly 16 downwardly. Post 28, the adjusting nut 32, the carrier 30 and a given number of the beams 34 form individual probes indicated generally at 44 for quad assembly buckling beam probe contactor 10. In the representation of FIG. 1, there are illustrated seven of nine probes 44 which are in columns of three and in three rows of the columns. As may be appreciated the number of individual beams for each probe 44 may readily vary, depending, of course, on the nature of the product being tested and the number of electrical current carrying wires needed for specific test point contact with pads P' on the semiconductor chip, assuming the product P constitutes such chip, FIGS. 2, 3.

In the illustrated embodiment of FIG. 1, the probe mount stripper plate assembly 16 fixedly supports cylinder 40 on the upper surface of mounting plate portion 22a of member 22 within which is housed coil spring 42. Each coil spring 42 is mounted concentrically about its rod 14. Mounted beneath head member 26 are a pair of circular discs 48 which are fixed to the head member 26 and are sized slightly larger than the diameter of cylinders 40. Interposed between the bottom of each cylinder 40 and the top of the probe mounting plate portion 22a is a spacer ring 43 whose height may be readily varied so as to vary the gap G between the top of cylinder 40 and the bottom of disc 48. Additionally, the thickness of each clip 45 which locates the head member 26 and thus the vertical height of the elements carried thereby relative to the probe mount stripper plate assemby 16 and which snaps between collar 14a and the top of head member 26, functions to vary the gap G which is the permissible rise of the stripper plate 18 relative to the probe mount 12. Thus, as will be seen hereinafter, this controls the amount of projection and/or deflection of beams 34 during electrical testing of the product. The coil springs 42, which are sandwiched between discs 48 and the upper surface of plate portion 22a of stripper plate assembly 22, bias the probe mount stripper plate assembly 16 towards the probe mount 12 such that the probe tips of the beams 34 are initially withdrawn into holes 90 of the stripper plate 18, FIGS. 2, 3, and do not tend to project from the bottom of that member, absent movement of the stripper plate 18 after the bottom of the stripper plate 18 contacts the underlying product P which is supported on a movable horizontal support surface as defined by table top 50.

While it may be appreciated that the invention has application to a single probe 44, the employment of multiple probes 44 permits the testing simultaneously of multiple chips or equivalent products P during or after manufacture. FIGS. 2 and 3 illustrate the operation of a single probe 44 of contactor 10 relative to a single product P underlying a portion of stripper plate 18, for simplicity purposes. In that respect, each probe 44 is primarily constituted by post 28 which is of metal rod form being fixedly mounted at its upper end to head 26, FIG. 1. The post 28 has threaded portion 28a over an extent of its length, intermediate of its ends. Below threaded portion 28a it is enlarged and squared in cross-sections, at 28b, which functions as a guide for a molded tubular slide indicated at 56, also of square cross-section, and forming part of the carrier or potted slide assembly 30. Threaded to the threads 52 of post 28, is the elongated cylindrical adjusting nut 32 which terminates in its lower end in an enlarged or flanged head 32a which abuts an enlarged head 56a of slide 56. Screws 57 at diagonally opposite corners of slide head 56a have their heads 57a abutting the top of flange 32a such that as the nut 32 is rotated about its axis, see arrow 58, FIG. 2, the slide 56 moves vertically upwardly as indicated by arrow 60. The potted slide assembly or carrier 30 therefore is carried upwardly in the same direction.

Potted slide assembly 30 comprises a plurality of coated beams 34, the beams 34 passing through holes 62a within offset guides 62 at the lower end of slide 54 and slidably through holes 64a and 66a of paired bottom guides 64 and 66, respectively. The bottom guides 64 and 66 are fixed to post portion 28c. Post 28 is bored at 70, counterbored at 72, and at 74, progressively from the bottom end of post 28. The coated wires 34 are potted at 63 fixing the wires 34 to slide 56, within assembly 30.

Postioned within the counterbore 72 is an inverted cylindrical cup 75 having an outside diameter conforming to the diameter of counterbore 72. The cup 75 has an internal diameter which is larger than that of portion 76a of a stripper plate support pin 76 which pin projects through the cup 75. Reduced diameter portion 76b passes slidably through a hole 78 within cup transverse wall 75a. Pin 76 is provided with an enlarged diameter head 76d. Portion 76b is provided with a circular groove 77. Groove 77 receives a snap ring 80. The cup 75 may be wedge fitted to counterbore 72 within the lower end of post 28. Pin 76 fixedly carries disc or plunger 82 sized so as to slidably fit within the counterbore 74.

Further, the stripper plate 18 is provided with a hole 84, which is counterbored at 86 from the bottom of the stripper plate, within which fits the headed end 76d of pin 76 to fix stripper plate 18 to pin 76.

Interposed about pin portion 76b is a helical coil spring 88 which abuts the end of pin portion 76a, at one end, and the transverse wall 75a of cup 75, at its opposite end. Spring 88 is compressed when the bottom surface 18a of the stripper plate 18 contacts the product or workpiece P being tested. Pin portion 76a enters the interior of cup 75 to a greater degree as seen in contrasting FIG. 2 with FIG. 3, to the extent where the probe tips 34a move flush with the lower ends of holes 90 within the stripper plate which receive the coated beams; thereafter the beam flex during continued relative movement between stripper plate 18 and post 28.

In contrasting FIGS. 2 and 3, as the stripper plate 18 is brought into contact with the product, by raising the table 24 bearing the product P, for instance, it is forced upwardly relative to post 28 until the probe tips 34a of the beams 34 contact the product and deflect a predetermined amount as for instance 0.010 inches to 0.020 inches defined by gap G between cylinder 40 and disc 26. Purposely, when the top of cylinder 40 abuts the bottom of disc 48 for each of the assemblies 38, terminating gap G while the beams continue their deflection, they do not take up any of the force application of the stripper plate against the product being tested. This is relieved by the direct abutment of cylinder 40 with disc 48 for the two assemblies 38. The reactive force is thus directly absorbed by the mechanism supporting the multiple beams, but not by the beams themselves. As may be appreciated, the beams 34 are completely independent of each other and buckle in varying amounts to accept product variations. Particularly by reference to FIG. 1, the number and size of the wires defining the coated beams 34 may be readily varied to meet conditions at hand. The beams are continuous wires running the complete length of assembly 30 and the height of probe contactor 10, and extend via cables 92 which project through the flanges 56a of slides 56 to electrical connector 11, FIG. 1. Thus continuous wires run from the bottom of the stripper plate 18, all the way to the electrical connector 11 leading to test apparatus (not shown) remote from the probe contactor 10.

While the beam wires may be one material throughout their length, two portions of different materials may be bonded or welded together to form a continuous wire.

The coated beams 34 are maintained at predescribed circumferential positions about the post 28 and in general aligned with holes 90 within the stripper plate 18 which slidably receive the probe tip portions 34a of the those beams. By laterally offsetting the holes within upper guide 62 relative to the lower guides 64 and 66, predetermined directions of deflection of beams 34 are achieved to insure minimum contact between the individual wires of each of the probes. In the illustrated design, 0.005 inch wire is utilized as the buckling beam core and a thin coating film of electrical insulation is provided to the wires. In that respect, the wires and their coating may be of the type shown in U.S. Pat. No. 3,806,801, assigned to the common corporate assignee.

Each coil spring 88 of the plunger assembly associated with each post 28 contributes to the biasing force tending to maintain the stripper plate 18 in contact with the upper surface of the product P being tested during buckling beam probe contactor use. The change in position of the stripper plate 18, and post 28 and the members or elements carried thereby, are exagerated as well as the deflection of the beams for purposes of illustration. The system operates in the manner described and may be appreciated by ready comparison between FIGS. 2 and 3. The improved buckling beam probe contactor 10 of the present invention results in the elimination of the probe to transformer interface to reduce the number of opens previously encountered in such devices. The probe tips 34a are protected from mechanical damage since they are housed within the stripper plate holes 90 until the moment of contact of the bottom surface 18a of the stripper plate 18 with the product P to be tested. The stripper plate 18 has its holes 90 sized to the diameter of the coated beams carried thereby and the pattern and number of beams employed are purposely designed to meet the needs of the products being tested such that the system provides better alignment of each beam relative to its contact pad P′ on the product P being tested. The apparatus reduces the need for extremely tight tolerances on each of the individual probe components. Since the beams can be extended by utilization of the adjustment nut 32, those beams may be projected when the stripper plate 18 is in raised position so that the tips 34a can be resurfaced to insure excellent low ohmage contact between the exposed wires of probe tips 34a. This insures a longer life for the coated beams.

Additionally, the make up of the individual probes, as seen best in FIGS. 2 and 3, provides repair capability in the event that a probe tip is damaged or must be resurfaced.

The present invention has been described with the probes of the probe contactor 10 utilized to form electrical connections with the pads P′ of a semiconductor chip as product P. It should be understood that the probe wires or coated beams may be utilized in testing electrically conductive members of devices of similar or varing form to those of semi-conductor chips.

The buckling beam probe contactor of the present invention therefore solves the problems of high tip damage with associated repair costs and mistest due to poor contact at the space transformer interface characterizing the prior probe contactors.

While the invention has been particularly shown and described with reference to a preferred embodiment thereof, it will be understood by those skilled in the art that the foregoing and other changes in form and details may be made therein without departing from the spirit and scope of the invention.

We claim:

1. In a buckling beam test probe assembly comprising an array of current carrying electrically conductive beams mounted so as to buckle when biased into contact with the product to be tested, the improvement wherein said array of buckling beams comprises continuous wires to the test apparatus interface, and said assembly comprises:
   at least one support post movable, relatively, towards and away from the product,
   a slide mounted on said support post,
   means for fixing said wires intermediate of their ends to said slide,
   a stripper plate,
   spring loaded means mounting said stripper plate to the bottom of said support post and overlying the product,
   slidable guide means carried by said stripper plate for aligning the ends of the probe wires with the underlying product for precise contact with product test points, and means for adjusting the axial position of the slide relative on said post to adjust said beams lengthwise of said stripper plate;

whereby, during relative movement of said support post towards the product, said stripper plate initially contacts the product to accurately locate the ends of the wires relative to the product, the wires function as uninterrupted conductors to reduce electric opens and shorts within the test equipment, said stripper plate protects the probe tips from damage, and wherein the beams deflect intermediate of said slide and said stripper plate to insure low ohmage engagement with the product.

2. The assembly as claimed in claim 1, wherein said at least one support post is bored axially at its end facing said underlying stripper plate, a pin is fixedly mounted to said stripper plate on the side remote from the product and projects into said bore, a coil spring is interposed within said bore between said pin and said post tending to bias said pin and said stripper plate carried thereby away from the lower end of said post, and means for preventing disengagement between said pin and said post but permitting limited retraction of said pin within said post against the bias of said spring upon contact of said stripper plate with the top of said product; whereupon, during continued depression of said post relative to the underlying product, the beams deflect to ensure electrical contact between the beams and the product due to the force of beam deflection.

3. The assembly as claimed in claim 1, wherein, said beams slidably pass through said stripper plate, said slide is concentrically positioned on said post remote from said stripper plate, guide means on said post guide said slide for movement axially on said post but prevent rotation about the axes of said post, said post is threaded over an extent of its length adjacent said slide and said guide means, a rotatable nut is threaded to said post, means operatively engage said slide with said nut such that said nut is free to rotate and to move axially while said slide is prevented from rotating relative to said post but is free to move longitudinally relative to said post; whereby, said beams may be retracted and extended relative to said stripper plate through which the tips of said beams pass, whereby said stripper plate, when projected away from the end of said post by said coil spring fully houses the tips of said beams to protect the ends thereof.

4. The assembly as claimed in claim 3, further comprising a fixed probe mount extending vertically relative to said at least one support post and being fixedly connected to the upper end of said post, at least one spring plunger assembly being borne by said probe mount and fixed at its lower end to said stripper plate, such that during relative depression of said probe mount vertically and the post carried thereby in the direction of the product upon contact of said stripper plate with the product, the plunger assembly carried by the post and said at least one probe mount spring plunger assembly are compressed to stabilize stripper plate movement relative to said support post and the probe mount supporting that post, maintain horizontal orientation of said stripper plate relative to the product being tested during its movement, and absorb fully the thrust force of said stripper plate acting on the product being tested.

5. The assembly as claimed in claim 4, wherein said least one spring plunger assembly comprises an upright rod mounted to said probe mount, a stripper plate support member overlying said probe mount, said rod slidably projecting through said stripper plate support member, a head member fixedly mounted to said upright rod above said stripper plate support member and fixedly mounting said at least one support post, a coil spring concentrically surrounding said upright rod and operatively engaging said stripper plate support member and said head member, and a cylinder surrounding said interposed coil spring and being of a length so as to operatively define a gap between said cylinder and said head member to limit movement of said head member said post and said beams carried thereby relative to said stripper plate and to bottom out said head member against said cylinder to thereby limit displacement of said beams and resulting beam deflection upon contact with the product being tested and to absorb the reactive force resulting from contact of said stripper plate with the top of the product being tested and to dissipate that reactive force through said assembly.

6. The assembly as claimed in claim 5, wherein a variable height spacer ring is interposed between the end of said cylinder and one of said head member and said stripper plate support member and being sized thereto to operatively vary the gap between said cylinder and said head member.

7. The assembly as claimed in claim 5, wherein a disc is fixedly mounted to the bottom of said head member concentric with said rod and is of a diameter sized to that of said cylinder, such that said gap is formed between the bottom of said disc and the top of said cylinder.

8. The assembly as claimed in claim 6, wherein a disc is fixedly mounted to the bottom of said head member concentric with said rod and is of a diameter sized to that of said cylinder, such that said gap is formed between the bottom of said disc and the top of said cylinder.

* * * * *